(12) United States Patent
Mayer et al.

(10) Patent No.: US 7,405,944 B2
(45) Date of Patent: *Jul. 29, 2008

(54) PRINTED CIRCUIT BOARD RETAINING DEVICE

(75) Inventors: Mark J. Mayer, Sagamore Hills, OH (US); Alan B. Toot, Warren, OH (US)

(73) Assignee: Lumination LLC, Valley View, OH (US)

(*) Notice: Subject to any disclaimer, the term of this patent is extended or adjusted under 35 U.S.C. 154(b) by 0 days.

This patent is subject to a terminal disclaimer.

(21) Appl. No.: 11/621,830

(22) Filed: Jan. 10, 2007

(65) Prior Publication Data

US 2007/0109751 A1    May 17, 2007

Related U.S. Application Data

(63) Continuation-in-part of application No. 11/029,843, filed on Jan. 5, 2005, now Pat. No. 7,170,751.

(51) Int. Cl.
*H05K 5/00* (2006.01)
*B23P 19/00* (2006.01)

(52) U.S. Cl. ............ 361/759; 361/704; 361/752; 29/758

(58) Field of Classification Search ......... 361/720, 361/704, 752, 719, 759; 219/443.1; 315/194; 29/829, 830, 758, 761
See application file for complete search history.

(56) References Cited

U.S. PATENT DOCUMENTS

| | | | |
|---|---|---|---|
| 5,089,936 A | 2/1992 | Kojima et al. | |
| 5,461,541 A | 10/1995 | Wentland et al. | |
| 5,875,097 A | 2/1999 | Amaro et al. | |
| 6,252,773 B1 | 6/2001 | Werner | |
| 6,449,163 B1* | 9/2002 | Stark et al. | 361/752 |
| 6,714,414 B1 | 3/2004 | Dubovsky et al. | |
| 6,791,183 B2 | 9/2004 | Kanelis | |
| 6,980,437 B2* | 12/2005 | Bright | 361/704 |
| 7,033,060 B2 | 4/2006 | Dubuc | |
| 2001/0030852 A1* | 10/2001 | Edevold et al. | 361/704 |
| 2002/0170905 A1* | 11/2002 | Peterson et al. | 219/443.1 |
| 2005/0082989 A1* | 4/2005 | Jones et al. | 315/194 |

* cited by examiner

*Primary Examiner*—Ishwar Patel
*Assistant Examiner*—Andargie M Aychillhum
(74) *Attorney, Agent, or Firm*—Fay Sharpe LLP

(57) ABSTRACT

A retaining device holds a printed circuit board to a structure that has channels for receiving the retaining device. The retaining device includes a body having portions configured for receipt into the channels of the structure, flexible portions and protuberances protruding away from a first surface adjacent each flexible portion. A method for holding the PCB to the heat sink is disclosed. A lighting assembly that includes the retaining device is also disclosed.

19 Claims, 6 Drawing Sheets

_US 7,405,944 B2_

PRINTED CIRCUIT BOARD RETAINING DEVICE

This application is a continuation-in-part application of application Ser. No. 11/029,843, filed Jan. 5, 2005 now U.S. Pat. No. 7,170,751, the entirety of which is incorporated by reference herein.

BACKGROUND OF THE INVENTION

Often times a heat sink is provided to dissipate heat generated by electrical components that are mounted to a printed circuit board ("PCB"). To maximize the amount of thermal energy transferred from the PCB to the heat sink, the surface area of the PCB in contact with the heat sink should be maximized. Because of surface imperfections of the two surfaces, better thermal transfer is achieved when pressure is applied to the PCB.

Additionally, PCBs are often mounted to a structure, whether that structure be a heat sink or not. Fastening the PCB to the structure is typically accomplished with a screw.

SUMMARY OF THE INVENTION

A retaining device holds a PCB to a structure that has channels for receiving the device. The retaining device includes a body having portions configured for receipt into channels of the structure and protuberances extending away from a surface of the body.

A method for mounting a PCB to a structure includes the following steps: facing a first surface of a PCB toward a first surface of a structure; placing a protuberance of a retaining device in contact with a second surface of the printed circuit board; applying a force on the retaining device in a direction towards the PCB; moving the retaining device such that a portion of the retaining device is received into a channel of the structure; and removing the force from the retaining device, whereby the protuberance exerts a force on the printed circuit board.

A lighting assembly includes a PCB, an LED mounted to the PCB, a mounting structure, and a retaining device. The mounting structure includes a mounting surface contacting the PCB and a first channel spaced from the mounting surface. The retaining device includes a flexible portion and a protuberance disposed on the flexible portion that contacts the PCB. To fasten the PCB to the mounting structure, a portion of the retaining device is received in the channel of the mounting structure.

DETAILED DESCRIPTION OF THE INVENTION

Figure 1:
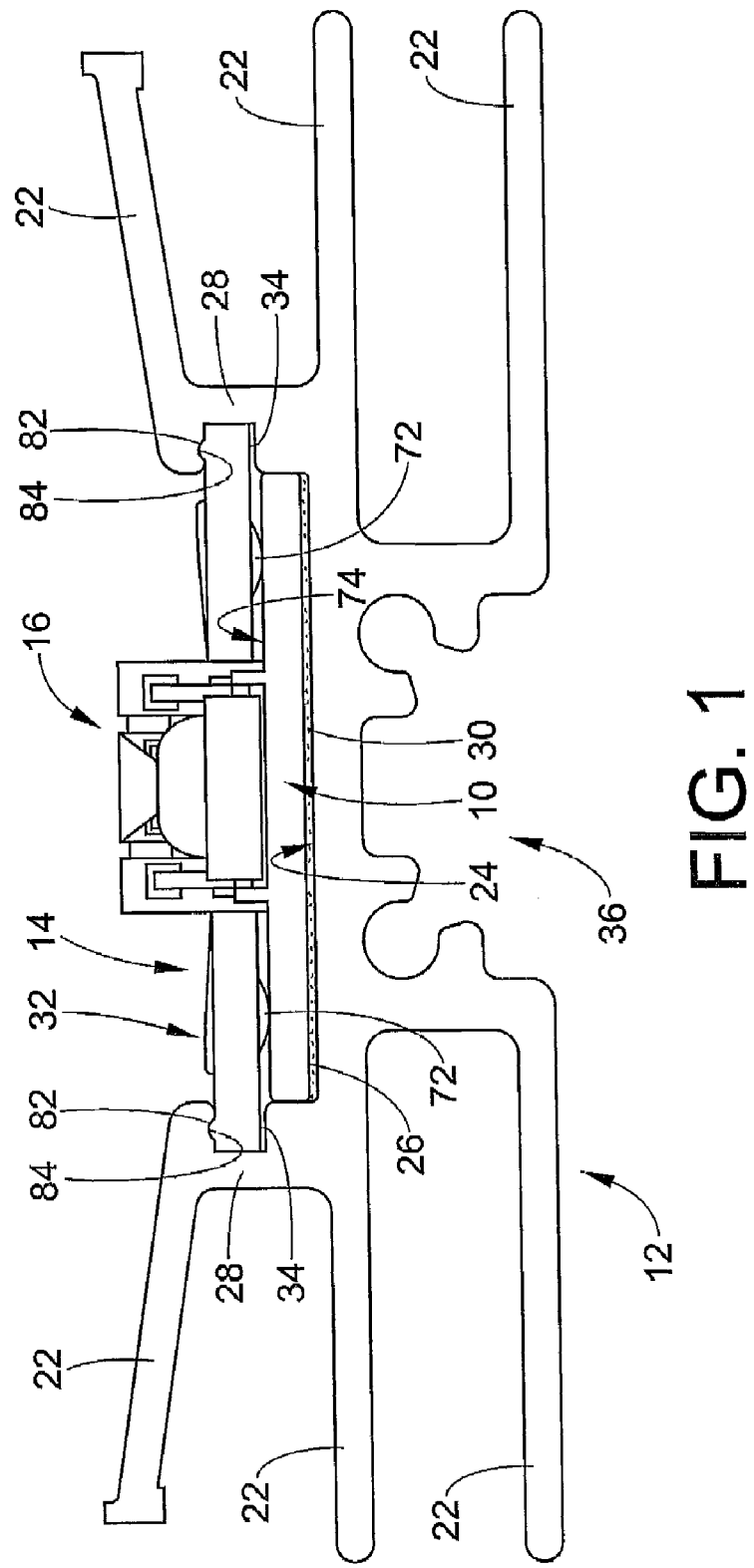
FIG. 1 is side view of a light assembly that includes a PCB retaining device.

With reference to FIG. 1, a printed circuit board 10 mounts to a structure, for example a heat sink 12, using a fastening device, which will be referred to as a cam 14. In the depicted embodiment, the PCB 10 is a long rectangular aluminum clad PCB (or metal core printed circuit board) to which a plurality of LEDs 16 are mounted. The fastening device described below is not limited to retaining the PCB depicted, but can be used with other PCBs. Traces (not shown) interconnect the LEDs 16 and are attached to a power source (not shown). Even though LEDs are depicted as being mounted to the PCB, other electrical components can also mount to the PCB. The LEDs 16 generate heat that is transferred to the PCB 10 and ultimately transferred into the heat sink 12. The cam 14 works in conjunction with the configuration of the heat sink 12 to apply pressure to the PCB 10 to retain the, PCB to the heat sink and to encourage greater surface area contact between the PCB and the heat sink.

The heat sink 12 is made of a heat conductive material, which in the depicted embodiment is an extruded aluminum. In the depicted embodiment, the heat sink is symmetric along a longitudinal axis 20 (FIG. 2) and includes a plurality of fins 22 that run parallel to the longitudinal axis to increase its surface area for more efficient heat dissipation. The heat sink 12 includes a mounting surface 24 that faces and/or contacts a lower, or first, surface 26 of the PCB 14. Two side walls 28 extend from the mounting surface 24 to define a channel 32 that runs along the longitudinal axis 20 in which the PCB 10 is disposed. As seen in FIG. 1, the fins 22 extend away from the side walls 28.

In the embodiment depicted, the side walls 28 are at least generally parallel to one another and spaced apart from one another a distance approximately equal to the width of the PCB 10. Each side wall 28 includes a cam receiving channel 34 running parallel to the longitudinal axis 20 of the heat sink. The cam receiving channels 34 are vertically spaced from the mounting surface 24 a distance approximately equal to the height of the PCB 10 and are configured to receive a portion of the cam 14. In the depicted embodiment, the cam receiving channels 34 run along the entire length of the heat sink 12; however, the channels 34 can be interrupted along the length of the heat sink.

In the depicted embodiment, the heat sink 12 also includes a mounting configuration 36 that allows the heat sink to attach to a support structure. One environment where this assembly can be located is inside a commercial refrigeration unit. Commercial refrigeration units typically include a plurality of lights mounted to a mullion that illuminate items stored in the unit. The mounting configuration 36 is adapted to allow for attachment of the heat sink 12 to such a mullion. Alternatively, the heat sink can include a mounting configuration adaptable for other environments.

The cam 14 holds the PCB 10 against the mating surface 24 of the heat sink 12. It is very difficult to manufacture surfaces that are truly flat. Typically, when two "flat" surfaces are brought in contact with one another, three points from the first "flat" surface, i.e. a truly flat plane, contact three points from the second "flat" surface. By applying pressure the PCB 10, more points that make up the lower surface 26 of the PCB 10 can contact more points that make up the mounting surface 24 of the heat sink 12. Having more points that are in contact with one another results in more thermal energy directly passing from the PCB 10 into the heat sink 12 because heat does not have to travel through air, which is not as conductive as the thermally conductive material of the heat sink. To further facilitate heat transfer between the PCB 10 and the heat sink 12, a compressible thermally conductive material 30, for example a tape having graphite, can be interposed between the lower surface 26 of the PCB 10 and the mounting surface 24 of the heat sink 12.

In the depicted embodiment, the cam 14 is a substantially planar body 50 made of plastic having opposing at least substantially planar surfaces: upper surface 52 and lower surface 54. The planar body 50 can have a generally American football-shape in plan view such that the planar body 50 is axially symmetric in both a longitudinal axis 58 and a transverse axis 62. The length of the planar body 50 is greater than its width.

The cam body 50 includes flexible portions that act similar to a leaf spring to retain the PCB 10 against a mounting structure. As seen in the embodiment depicted in FIGS. 3 and 4, two tabs 64 that are integral with the cam body 50 are defined by U-shaped cut outs 66 that extend through the planar body 50. The tabs are symmetrical with respect to both the longitudinal axis 58 and the transverse axis 62, extending in opposite directions from the transverse axis 62.

Protuberances 72 extend away from the lower surface 54 of each tab 64. The protuberances 72 are located near the distal end 68 of each tab 64, i.e. the end furthest away from the intersection of the tab and the remainder of the body. In the depicted embodiment, the protuberances 72 are substantially dome-shaped, which limits the contact surface between the protuberance and an upper surface 74 of the PCB 10. The tabs 64 acting in concert with the protuberances 72 act as a sort of leaf spring when the cam 14 is locked into place.

With reference back to FIG. 1, the protuberances 72 allow the cam 14 to apply a force on the PCB 10 in a direction normal to the mating surface of the structure to which the PCB mounts, for example heat sink 12. To affix the PCB 10 to the heat sink 12, the cam 14 is positioned on the upper surface 74 of the PCB 10 and a downward force, i.e. a force in a direction normal to the mounting surface 24, is applied to the cam 14. The downward force results in the tabs 64 flexing upward because of the protuberances 72. Then the cam 14 is rotated such that a portion of the peripheral edge 56 is received inside the cam receiving channels 34. At least the portion of the body 50 received in the cam receiving channels 34 has a thickness approximately equal to the cam receiving channel 34. With a portion of the body 50 being received in the cam receiving channels 34, the tabs 64 remain flexed upward. The upward flexing of the tabs 64 results in a downward force on the PCB 10. Since the tabs 64 are axially symmetric with respect to two axes, a balanced load is applied to the PCB 10. To increase the amount of pressure that is applied to the PCB 10 by the tabs 64, either the length of the tabs can be changed or the height of the protuberances 72 can be changed.

With reference back to FIG. 3, ridges 82 extend upwardly from the upper surface 52 of the body 50. The ridges 82 run substantially parallel to the portion of the peripheral edge 56 adjacent the ridges 82. Two ridges are provided near each longitudinal end of the body 50 so that the cam 14 can be rotated either in a clockwise or counterclockwise direction to engage the cam receiving channels 34 (FIG. 1). With reference back to FIG. 1, mating grooves 84 are formed in the cam receiving channels 34 for receiving the ridges 82. The ridges 82 are semi-cylindrical in configuration so that they can be easily urged into the mating grooves 84.

The body 50 of the cam 14 has an appropriate thickness or height and the peripheral edge 56 is appropriately shaped with respect to the dimensions of the channel 32 that receives the PCB 10 so that when the cam 14 is rotated into the cam receiving channels 34 the ridges 82 are aligned substantially parallel to a longitudinal axis 20 of the heat sink 12. Furthermore, in one embodiment the peripheral edge 56 follows generally linear paths near the longitudinal ends of the cam 14. Linear portions 86 of the peripheral edge 56 are interconnected by curved portions 88 nearer the transverse axis 62 of the body. The curved portions 88 have a generally large radius, which gives the body the substantially American football-shaped configuration in plan view. The axially symmetric configuration allows the cam 14 to be rotated in either a clockwise or counterclockwise direction to engage the cam receiving channels 34. The linear portions 86 of the peripheral edge 56 provide a longer portion of the body 50 disposed in the cam receiving channel 34 to counteract the upward force applied on the cam 14 by the PCB 10. The cam body 50 can take alternative configurations; however, a symmetrical configuration can allow for either clockwise or counterclockwise rotation.

Figure 4:
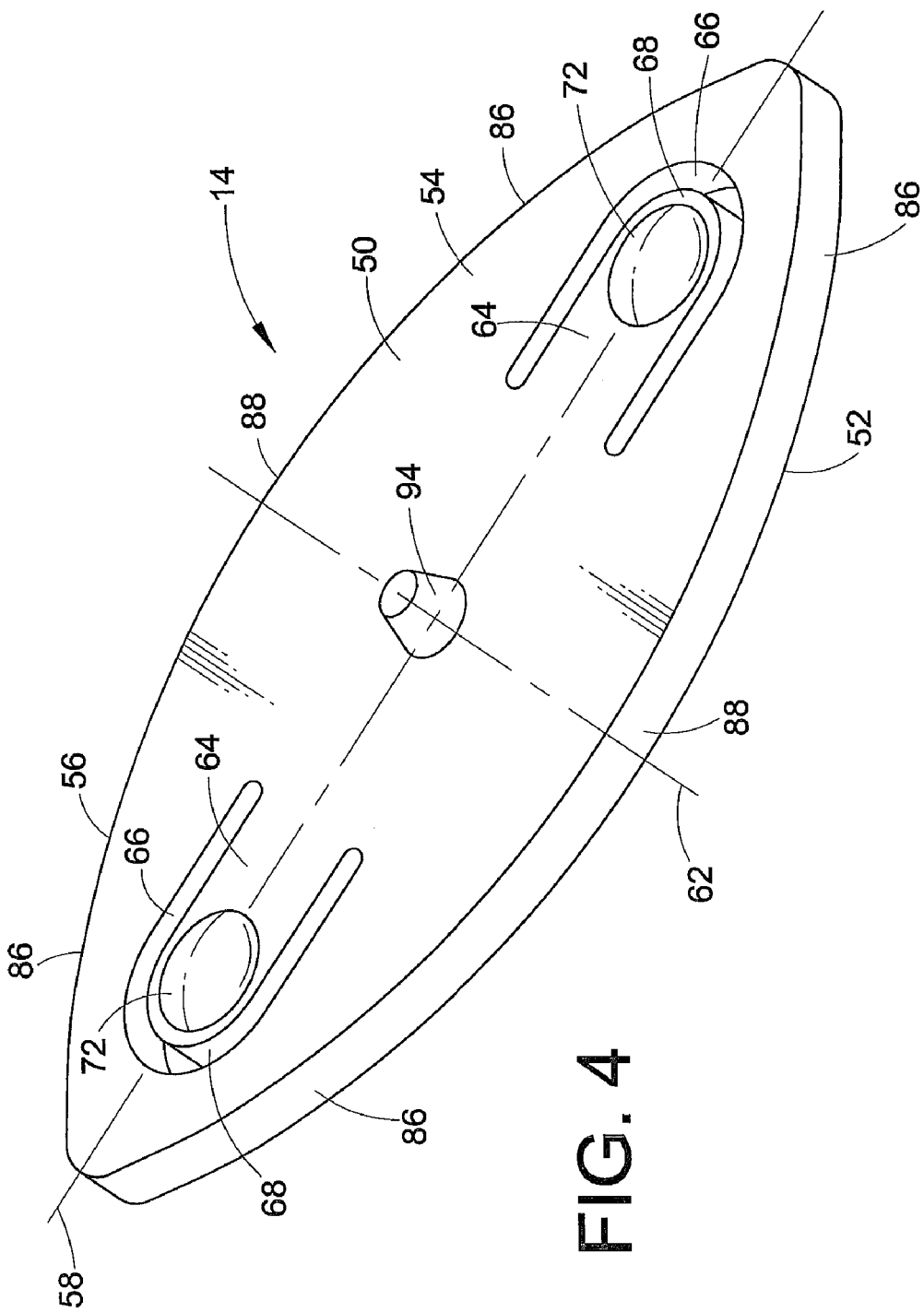
FIG. 4 is a second perspective view of the fastening device of FIG. 3.

To facilitate rotation of the cam, a recess 92 configured to receive a screwdriver is centrally located on an upper surface 52 of the body 50. With reference to FIG. 4, a locating post 94 is centrally located on the lower surface 54 of the body 50. In one embodiment, a corresponding mating hole 98 (FIG. 2) is provided in the PCB 10 for receiving the locating post 94.

As discussed above, the cam, or retaining device, can take many different configurations. In the embodiment depicted in FIGS. 5-7, the cam 114 is a substantially planar body 120 made of plastic or similar resilient material having opposing at least substantially planar surfaces: upper surface 122 and lower surface 124 (see FIG. 7). The cam 114 is symmetric in a plane, which is parallel to the planar surfaces 122 and 124, in that the portion of the cam that is disposed on one side of a first axis 128, which resides in the plane, can rotate about a second axis 132, which is normal to the plane and intersects the first axis, to provide the same shape on the other side of the first axis.

Figure 5:
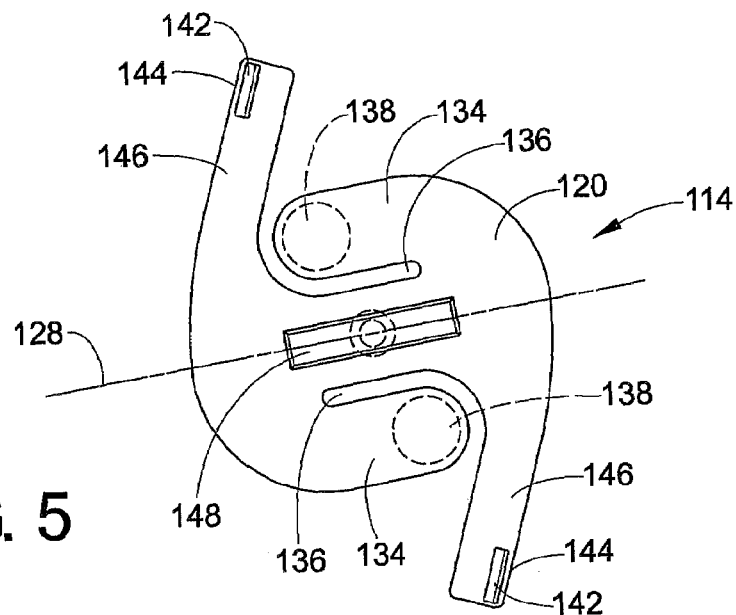
FIG. 5 is a plan view of another embodiment of a fastening device for use with a light assembly such as the one disclosed in FIG. 1.
Figure 6:
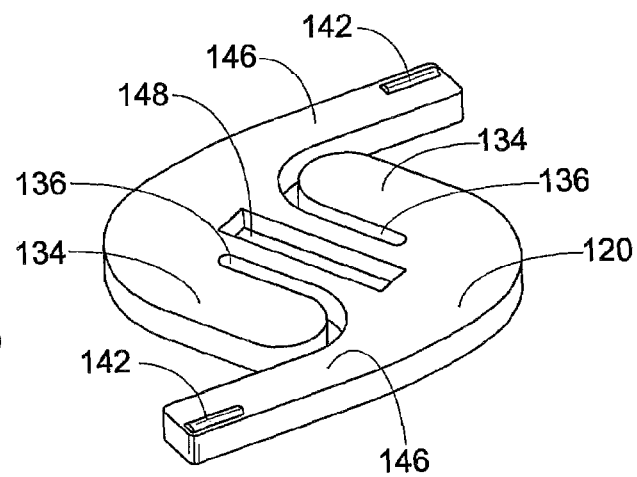
FIG. 6 is a perspective view of the fastening device depicted in FIG. 5.
Figure 7:
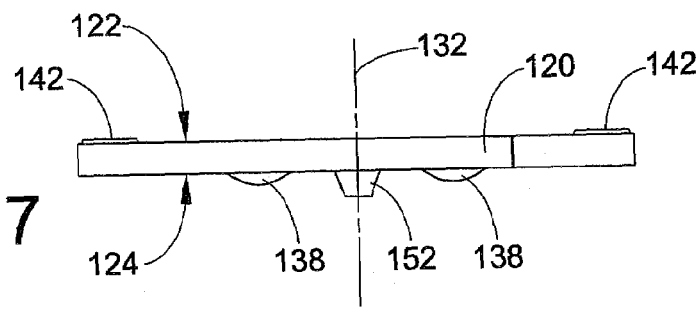
FIG. 7 is a side elevation view of the fastening device depicted in FIG. 5.

As seen in the embodiment depicted in FIGS. 5-7, the cam body 120 includes a flexible portion, e.g. two flexing tabs 134, that are defined by curvilinear cutouts 136 that extend through the planar body. Protuberances 138 extend from the lower surface 124 of each flexing tab 134. The protuberances 138 are located near a distal end, i.e. the end of the flexing tab that is furthest away from the intersection of the tab and the remainder of the body 120, and are substantially dome-shaped. Similar to the tabs 64 described with reference to the embodiment disclosed in FIGS. 3-4, the flexing tabs 134 acting in concert with the protuberances 138 act as a sort of leaf spring when the cam 114 is locked into place. The protuberances 138 allow the cam 114 to apply a force on the PCB in a direction normal to the mating surface of the structure to which the PCB mounts, for example, the heat sink 12 depicted in FIG. 1 and 2. To affix the PCB to the structure, the cam 114 is positioned on an upper surface of the PCB and a force in a direction normal to the mounting surface of the structure, i.e. the surface that the lower surface of the PCB faces and/or contacts, is applied to the cam. The normal force results in the flexing tabs 134 bending upward because of the protuberances. The cam is then rotated.

Figure 3:
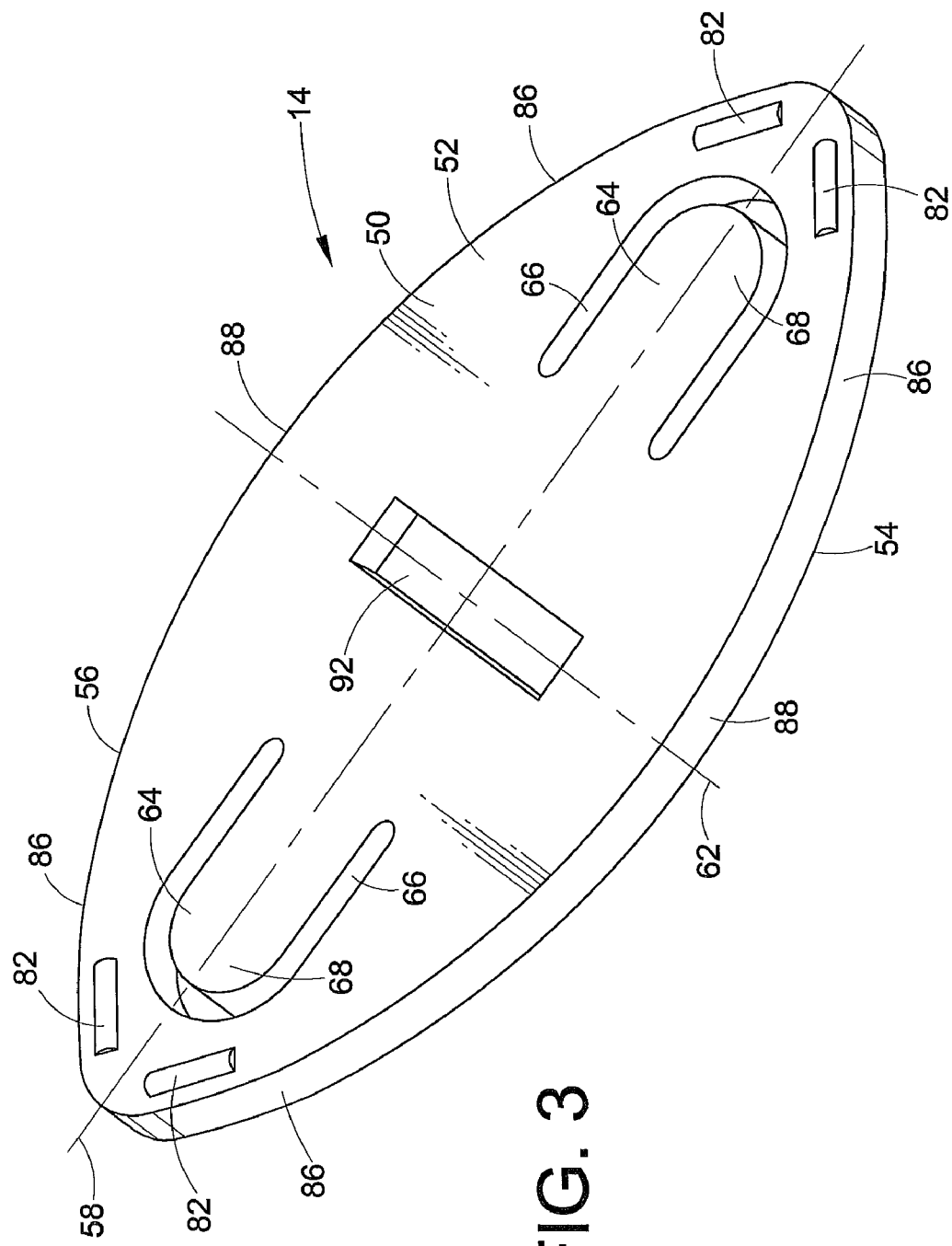
FIG. 3 is a first perspective view of the fastening device for use with the light assembly of FIG. 1.

Similar to the embodiment disclosed in FIGS. 3 and 4, the cam 114 disclosed in FIGS. 5-7 includes ridges 142 that extend upwardly from the upper surface 122 of the body. The ridges run in a direction that is substantially parallel to one another and also substantially parallel to a portion of a peripheral edge 144 of the body 120 adjacent each ridge. The ridges 142 cooperate with the mating grooves, for example the mating grooves 84 shown in FIG. 1, that are formed in the structure to which the PCB is to mount. The ridges 142 are semi-cylindrical in configuration to facilitate urging of the ridges into the mating grooves. In the embodiment depicted in FIGS. 5-7, the ridges 142 are formed at distal ends of a finger 146 that is also partially defined by the curvilinear cutout 136 that defines the flexing tabs 134.

To facilitate rotation of the cam 114, a recess 148 that is configured to receive a screwdriver is centrally located in the upper surface 122 of the cam. A locating post 152 is centrally located and extends from the lower surface 124 of the planar body 120. More particular to the embodiment depicted in FIGS. 5-7, the locating post 152 is aligned with the axis of rotational symmetry 132. The locating post 152 can cooperate with a corresponding mating hole, for example mating hole 98 in FIG. 2, which is provided in the PCB for receiving the locating post. Similar to the embodiment described in FIGS. 2 and 3, the body 120 of the cam 114 has an appropriate thickness or height so that it fits into a cam-receiving channel, similar to the channels 34 depicted in FIGS. 1 and 2. Moreover, the height of the cam can be minimized so that the cam does not block any light emanating from LEDs that are mounted to the printed circuit board.

Figure 8:
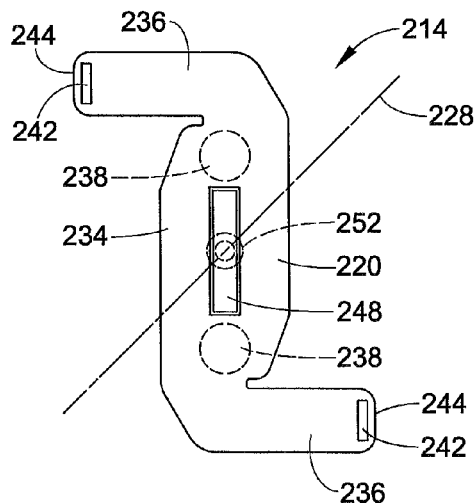
FIG. 8 is a plan view of another embodiment of a fastening device for use with a light assembly such as the one disclosed in FIG. 1.
Figure 9:
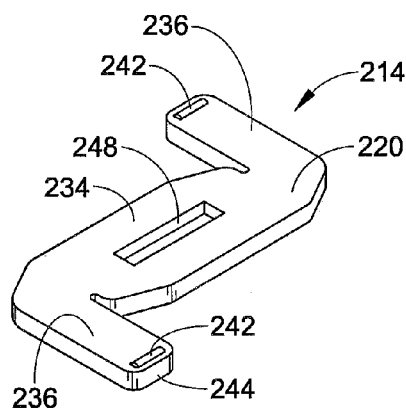
FIG. 9 is a perspective view of the fastening device depicted in FIG. 8.
Figure 10:
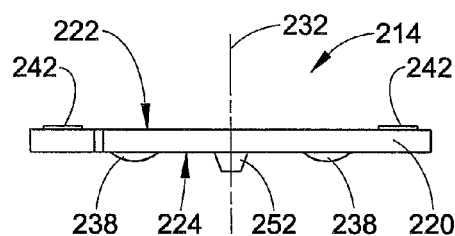
FIG. 10 is a side elevation view of the fastening device depicted in FIG. 8.

An alternative embodiment of a cam 214 is depicted in FIGS. 8-10. The cam 214 includes a substantially planar body 220 made of plastic or similar resilient material having opposing at least substantially planar surfaces: upper surface 222 and lower surface 224 (see FIG. 10). Similar to the cams described above, the cam 214 is symmetric in a plane, which is parallel to the planar surfaces 222 and 224, in that the portion of the cam that is disposed on one side of a first axis 228, which resides in the plane, can rotate about a second axis 232, which is normal to the plane and intersects the first axis, to provide the same shape on the other side of the first axis. Most clearly shown in FIG. 8, the cam 214 maintains a substantially S-shape in plan view.

The body 220 includes a central portion 234 and two fingers 236 extending from opposite ends of the central portion. Protuberances 238 extend from the lower surface 224 of the central portion. The protuberances 238 are disposed at opposite longitudinal ends of a recess 248 that is configured to receive a screw driver. The protuberances 238 are also spaced on opposite sides of a locating post 252. The locating post 252 and the recess 248 are similar to those found in the cams that are described above.

Ridges 242 extend upwardly from the upper surface 222. The ridges 242 are similar to the ridges found in the cams described above. The ridges have a substantially semi-cylindrical configuration that facilitates urging the ridges into the mating grooves of the structure to which the PCB that is retained by the cam 214 is to be mounted. The ridges 242 are located at distal edges of each finger 236, i.e. the edge that is furthest from where the finger extends from the central portion 234. The ridges 242 extend in generally the same direction, i.e., parallel to one another, and parallel to an adjacent edge 244 of the body 220. The body 220 of cam 214 has an appropriate thickness or height that corresponds to the receiving channel that will receive the distal portion of each finger 236. To affix a PCB to a structure, the cam 214 is positioned on the upper surface of the PCB. The cam 214 is then rotated about axis 232 so that the distal portions of each finger are received in a respective cam receiving channel, similar to the cam receiving channels 34 disclosed in FIG. 1. Due to the configuration of the ridges 242, which in this embodiment are substantially semi-cylindrical in configuration, and the flexibility of the body 220, including the fingers 236, the fingers 236 flex and/or the central portion 234 flexes resulting in a downward force exerted by the protuberances 238 on the PCB.

Figure 11:
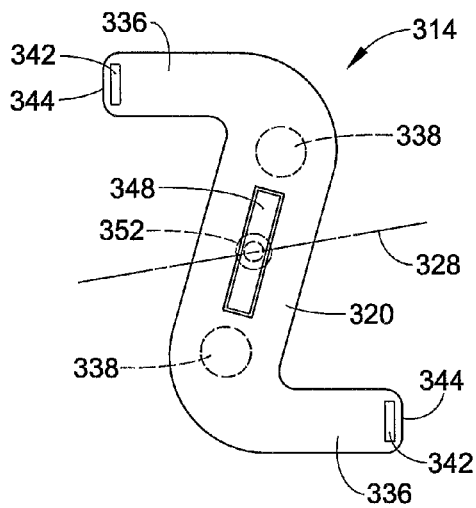
FIG. 11 is a plan view of another embodiment of a fastening device for use with a light assembly such as the one disclosed in FIG. 1.
Figure 12:
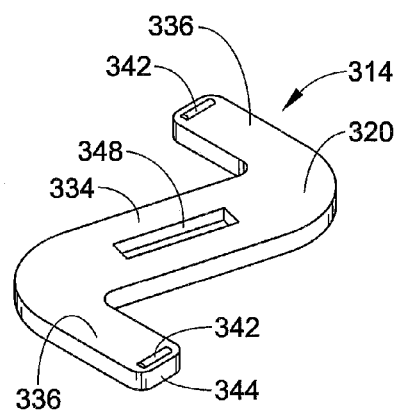
FIG. 12 is a perspective view of the fastening device depicted in FIG. 11.
Figure 13:
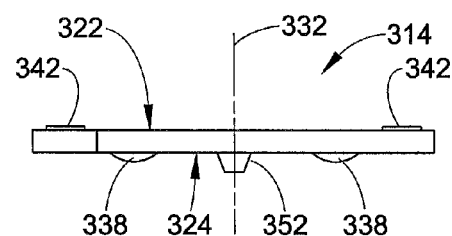
FIG. 13 is a side elevation view of the fastening device depicted in FIG. 11.

An alternative embodiment of a cam 314 is depicted in FIGS. 11-13. The cam 314 includes a substantially planar body 320 made of plastic or similar material having opposing at least substantially planar surfaces: upper surface 322 and lower surface 324 (see FIG. 13). Similar to the cams described above, the cam 314 is symmetric in a plane, which is parallel to the planar surfaces 322 and 324, in that the portion of the cam that is disposed on one side of a first axis 328, which resides in the plane, can rotate about a second axis, 332, which is normal to the plane and intersects the first axis, to provide the same shape on the other side of the first axis. Most clearly see in FIG. 11, the cam 314 maintains a substantially S-shape in plan view.

The body 320 includes a central portion 334 and two fingers 336 extending from opposite ends of the central portion. As opposed to the configuration of the embodiment depicted in FIGS. 8-10, where the fingers 236 extend at a substantial right angle from the central portion 234, the fingers 336 in the embodiment depicted in FIGS. 11-13 extend at a 45 degree angle from the central portion 334.

Protuberances 338 extend from the lower surface 324 of the central portion 334. The protuberances 338 are disposed at opposite longitudinal ends of a recess 348 that is configured to receive a screw driver. The protuberances 338 are also spaced on opposite sides of a locating post 352. The locating post 352 and the recess 348 are similar to those found in the cams that are described above.

Ridges 342 extend upwardly from the upper surface 322. The ridges 342 are similar to the ridges found in the cams described above. The ridges have a substantially semi-cylindrical configuration that facilitates urging the ridges into the mating grooves of the structure to which the PCB that is retained by the cam 314 is to be mounted. The ridges 342 are located at distal edges of each finger 336, i.e. the edge that is furthest from where the finger extends from the central portion 334. The ridges 342 extend in generally parallel to one another, and parallel to an adjacent edge 344 of the body 320. The body 320 of cam 314 has an appropriate thickness or height that corresponds to the receiving channel that will receive the distal portion of each finger 336. To affix a PCB to a structure, the cam 314 is positioned on the upper surface of the PCB. The cam 314 is then rotated about axis 332 so that the distal portions of each finger are received in a respective cam receiving channel, similar to the cam receiving channels 34 disclosed in FIG. 1. Due to the configuration of the ridges 342, which in this embodiment are substantially semi-cylindrical in configuration, and the flexibility of the body 320, including the fingers 336, the fingers 336 flex and/or the central portion 334 flexes resulting in a downward force exerted by the protuberances 338 on the PCB.

As mentioned above, the cam 14, or a plurality of cams, can be used in a lighting assembly, such as that depicted in FIGS.

Figure 2:
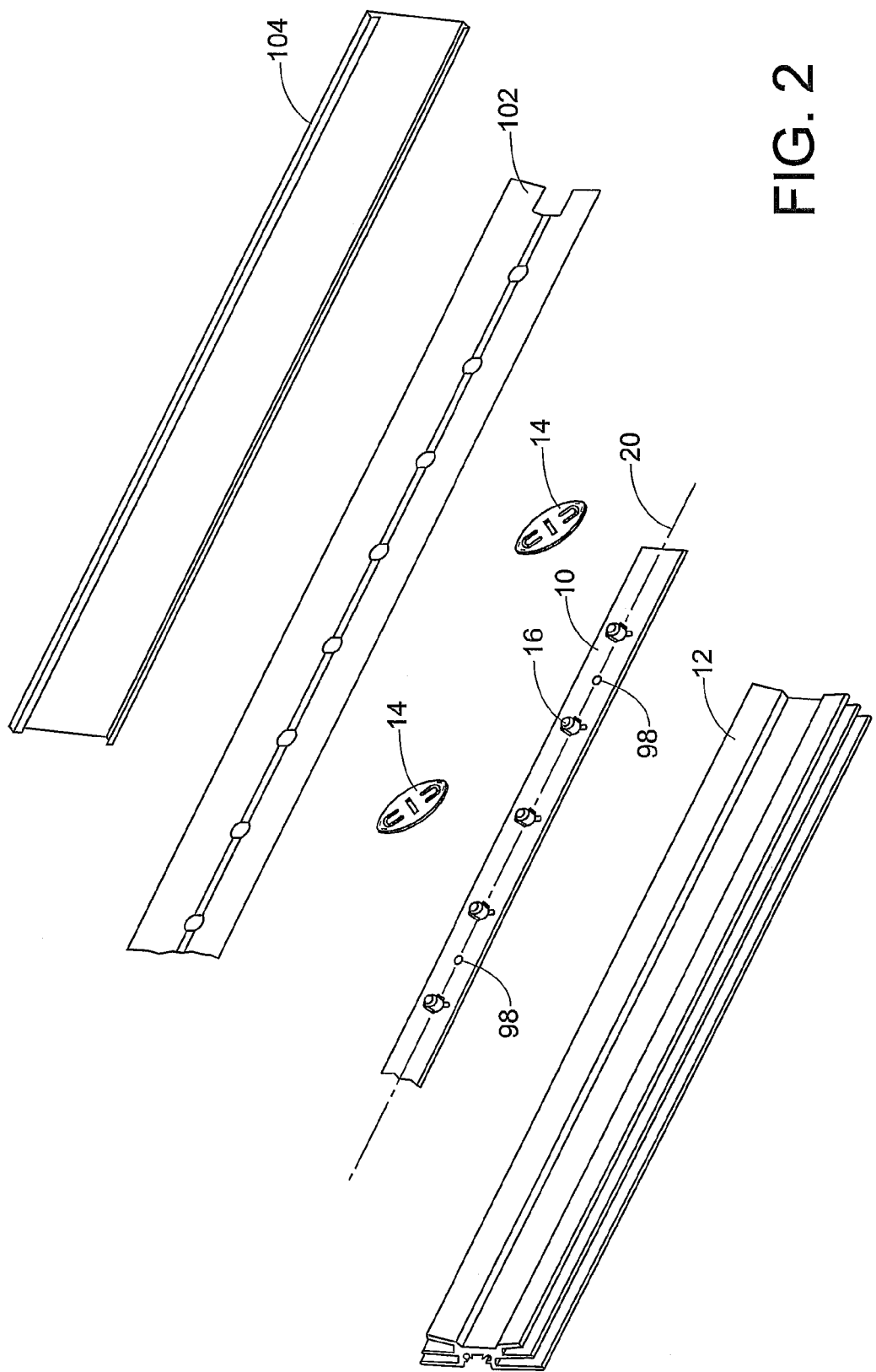
FIG. 2 is an exploded view of the light assembly of FIG. 1.

1 and 2. Only cam 14 is depicted in FIGS. 1 and 2; however, cams 114, 214 and 314 can also be used in addition to or in lieu of cam 14. As seen in FIG. 2, a reflector 102 and a protective cover 104 can also mount to the heat sink 12, or other structure to make up the lighting assembly. The height of the planar body of the cam (or planar body for the other cams that are disclosed) is less than the height of the LED 16. Such a configuration provides a clear path for the light emitted from the LED 16. Even though a substantially planar body for the cam is depicted, other low profile configurations, e.g. nonplanar configurations, can be used where the cam is used to retain a PCB 10 having light emitting electrical components mounted to it.

A retaining device for holding a PCB to a structure has been described with reference to certain embodiments. Many available alterations may occur to those skilled in the art upon reading the preceding detailed description. The invention is not intended to be limited solely to those embodiments described above, but is intended to include any device that comes within the scope of the appended claims.

The invention claimed is:

1. A device for retaining a printed circuit board to a structure that has channels for receiving the device, the device comprising a body having portions configured for receipt into a channel of a structure and a protuberance extending away from a first surface of the body; wherein the body further includes a flexible tab and the protuberance is located on the flexible tab.

2. The device of claim 1, wherein the body is symmetric.

3. The device of claim 1, further comprising an additional protuberance extending away from a first surface of the body.

4. The device of claim 1, further comprising a ridge formed on a second surface of the body adjacent a peripheral edge of the body.

5. The device of claim 1, further comprising a first ridge formed on a second surface of the body and a second ridge formed on a second surface of the body, wherein the first ridge extends in a direction that is substantially parallel to a direction in which the second ridge extends.

6. The device of claim 1, further comprising a recess configured to receive a screwdriver.

7. The device of claim 1, further comprising a locating post extending from the first surface of the body.

8. The device of claim 7, wherein the locating post is aligned with an axis of rotational symmetry for the device.

9. A method for holding a printed circuit board against a structure comprising:
    facing a first surface of a printed circuit board toward a first surface of a structure;
    placing a protuberance of a retaining device in contact with a second surface of the printed circuit board, the second surface being opposite the first surface;
    applying a force on the retaining device in a direction towards the printed circuit board resulting in a portion of the retaining device flexing;
    moving the retaining device such that a portion of the retaining device is received into a channel of the structure and the portion of the retaining device remains flexed; and
    removing the force from the retaining device, whereby the flexed portion of the retaining device exerts a force on the printed circuit board.

10. The method of claim 9, further comprising:
    placing a thermally conductive compressible material between the first surface of the printed circuit board and the first surface of the structure.

11. The method of claim 9, wherein the moving the retaining device step further comprises rotating the retaining device.

12. A light assembly comprising:
    a printed circuit board;
    an LED mounted to the printed circuit board;
    a structure having a mounting surface contacting the printed circuit board and a first channel spaced from the mounting surface;
    a cam including a first flexible portion and a protuberance disposed on or adjacent the first flexible portion, the protuberance contacting the printed circuit board, the cam having a portion configured for receipt in the first channel of the structure.

13. The assembly of claim 12, wherein the cam includes a ridge disposed on a side of the cam opposite the protuberance.

14. The assembly of claim 12, wherein the cam comprises a substantially planar body having a height that is about equal to a distance that the first channel is spaced from the mounting surface.

15. The assembly of claim 12, wherein the cam has a height that is less than a height of the LED.

16. The assembly of claim 12, wherein the first flexible portion is defined by a curved cut-out through the cam.

17. The assembly of claim 12, wherein the cam has a substantially S-shaped configuration in plan view.

18. The assembly of claim 13, wherein the ridge is generally parallel to an adjacent peripheral edge of the cam.

19. The assembly of claim 13, wherein the structure includes a mating groove that receives the ridge.

* * * * *